(12) United States Patent
Cheng et al.

(10) Patent No.: US 9,905,625 B2
(45) Date of Patent: Feb. 27, 2018

(54) ORGANIC LIGHT-EMITTING DIODE (OLED) DEVICE AND DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/800,522

(22) Filed: Jul. 15, 2015

(65) Prior Publication Data

US 2016/0126302 A1 May 5, 2016

(30) Foreign Application Priority Data

Oct. 31, 2014 (CN) .......................... 2014 1 0602660

(51) Int. Cl.
*H01L 27/32* (2006.01)
*H01L 51/52* (2006.01)

(52) U.S. Cl.
CPC ...... *H01L 27/3272* (2013.01); *H01L 51/5253* (2013.01); *H01L 27/3246* (2013.01); *H01L 2251/303* (2013.01)

(58) Field of Classification Search
None
See application file for complete search history.

(56) References Cited

U.S. PATENT DOCUMENTS

| | | | |
|---|---|---|---|
| 2005/0073243 | A1 | 4/2005 | Yamazaki et al. |
| 2007/0182314 | A1 | 8/2007 | Oh et al. |
| 2008/0309235 | A1* | 12/2008 | Yamazaki .......... H01L 27/3272 313/512 |
| 2009/0021157 | A1 | 1/2009 | Kim et al. |
| 2011/0114957 | A1 | 5/2011 | Kim et al. |
| 2012/0168743 | A1 | 7/2012 | Lee et al. |
| 2014/0077183 | A1 | 3/2014 | Lee et al. |

FOREIGN PATENT DOCUMENTS

| | | |
|---|---|---|
| CN | 101179110 A | 5/2008 |
| CN | 102169907 A | 8/2011 |
| CN | 102694052 A | 9/2012 |

(Continued)

OTHER PUBLICATIONS

Second Office Action regarding Chinese application No. 201410602660.7, dated Sep. 21, 2016. Translation provided by Dragon Intellectual Property Law Firm.

(Continued)

*Primary Examiner* — Jack Chen
(74) *Attorney, Agent, or Firm* — Harness, Dickey & Pierce, P.L.C.

(57) ABSTRACT

The present disclosure relates to an organic light-emitting diode (OLED) device and a display device. The OLED device may include a substrate, thin film transistors (TFTs), an anode, a cathode, and an organic light-emitting layer between the anode and the cathode and configured to emit light. The organic light-emitting layer may be provided with a light-blocking layer which is configured to block ultraviolet (UV) light and arranged at a light-exiting side of the organic light-emitting layer. The display device may include the OLED device.

19 Claims, 3 Drawing Sheets

(56) References Cited

FOREIGN PATENT DOCUMENTS

| CN | 102694053 A | 9/2012 |
|---|---|---|
| CN | 102969361 A | 3/2013 |
| CN | 103579287 A | 2/2014 |
| TW | 546853 B | 8/2003 |

OTHER PUBLICATIONS

First Office Action regarding Chinese application No. 201410602660.7, dated Mar. 22, 2016. Translation provided by Dragon Intellectual Property Law Firm.
Notification of Reexamination of Chinese Application No. 201410602660.7, dated Jul. 19, 2017. Translation provided by Dragon Intellectual Property Law Firm.

\* cited by examiner

ORGANIC LIGHT-EMITTING DIODE (OLED) DEVICE AND DISPLAY DEVICE

CROSS-REFERENCE TO RELATED APPLICATION

The present application claims a priority of the Chinese patent application No. 201410602660.7 filed in China on Oct. 31, 2014, which is incorporated herein by reference in its entirety.

TECHNICAL FIELD

The present disclosure relates to the light-emitting diode field, more particular to an organic light-emitting diode (OLED) device and a display device.

BACKGROUND

An organic light-emitting diode (OLED) device has the advantages, such as low-consumption, high-luminance, fast-response, wide visual angle and light-weight and so forth, which has been widely used in mobile communication terminals, personal digital assistances (PDAs), tablet computer and so forth. By compared with a liquid crystal display (LCD), a manufacturing process for the OLED devices is relatively simple and the cost is reduced too. And most important elements within an OLED display device are the OLED devices.

An organic light-emitting layer or thin film transistors (TFTs) within the OLED device may result in performance mutation or performance deterioration after being subject to ultraviolet (UV) light illumination. Specifically, with respect to oxide TFTs within the OLED device, after being subject to UV light illumination, valence band electrons and forbidden band gap enable electrons that are captured collectively to easily absorb energy, then to transit to the conduction band, thereby forming multiple electron-hole pairs. Thereafter a threshold voltage (Vth) may experience drift and sub-threshold swing (SS) may be increased, which causes an ON/OFF ratio to become smaller, thereby the whole OLED device may deteriorate and the displayed pictures may worsen significantly.

SUMMARY

One of objects of the present disclosure is to provide an organic light-emitting diode (OLED) device and a display device, which can effectively prevent adverse impact caused by UV light and have a stable and reliable display effect.

According to an aspect of the present disclosure, an OLED device is provided, which may include a substrate, thin film transistors (TFTs), an anode, a cathode, and an organic light-emitting layer between the anode and the cathode and configured to emit light. And the organic light-emitting layer may be provided with a light-blocking layer which is configured to block UV light and arranged at a light-exiting side of the organic light-emitting layer.

Alternatively, the cathode may be provided with a passivation layer at its outer side; the passivation layer may be provided with a thin film layer at its outer side; and the thin film layer may be provided with the light-blocking layer at its outer side.

Alternatively, the cathode may be provided with a passivation layer at its outer side; the passivation layer may be provided with a thin-film layer at its outer side; and the light-blocking layer may be provided between the passivation layer and the cathode.

Alternatively, the cathode may be provided with a passivation layer at its outer side; the passivation layer may be provided with a thin film layer at its outer side; and the light-blocking layer may be provided between the thin film layer and the passivation layer.

Alternatively, the cathode may be provided with a passivation layer at its outer side; the passivation layer may be provided with a thin film layer at its outer side; the cathode may be provided with the light-blocking layer at its inner side; and the light-blocking layer may be provided between the cathode and the organic light-emitting layer.

Alternatively, the organic light-emitting layer may include light-emitting areas and non-light-emitting areas; the light-blocking layer may include a plurality of light-blocking units; and the plurality of light-blocking units may correspond to the non-light-emitting areas, respectively.

Alternatively, a length of each of the plurality of light-blocking units may be substantially same as a length of the non-light-emitting area within the organic light-emitting layer.

Alternatively, a plurality of pixels may be formed by separating the organic light-emitting layer through a plurality of pixel separating walls; the TFTs may be provided between the substrate and the anode; the TFTs may be arranged in one-to-one correspondence with the plurality of pixel separating walls; and the plurality of light-blocking units may be arranged in one-to-one correspondence with the plurality of pixel separating walls.

Alternatively, the light-blocking layer may be made of ZnO, IGZO, $TiO_2$, $SnO_2$, ITZO, AlZO, ZnSnO, HfInZnO, AZTO, AlZnSnO, or ZnON.

Alternatively, the TFTs may be top-gate TFTs or bottom-gate TFTs.

According to another aspect of the present disclosure, a display device is provided, which may include any one of the above OLED devices.

By arranging a light-blocking layer within the OLED device, the technical solutions according to embodiments of the present disclosure can prevent performance of a material of an organic light-emitting layer or TFTs from adverse impact caused by UV light, thereby maintaining performance of the entire OLED device.

DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED EMBODIMENTS

In the description of the present disclosure, unless indicated otherwise, "a plurality of" means two or more than two. Orientations or position relations indicated by terms like "on", "under", "left", "right", "in" and "out" etc. are orientations or position relations shown in figures, which are only used for easily describing the present disclosure, other than indicating explicitly or implicitly elements herein have to be manufactured and operated at a certain orientation. Therefore, these cannot be regarded as limitations to the present disclosure.

In the description of the present disclosure, it should be appreciated that, unless otherwise indicated or limited, terms like "arrange", "connect", and "communicate" should be interpreted broadly. For example, connections can either be a fix connection, or a detachable connection, or an integral connection. In addition, connections can also be a mechanical connection, an electrical connection. Moreover, connections can also be a direct connection, or an indirect connection via an intermediate medium. As far as a person skilled in the art can appreciate specific meaning of these terms in the disclosure based on real situations.

The below detailed description on some embodiments of the present disclosure will be given. A skilled person can appreciate that these embodiments are only used to illustrate the present disclosure, but not to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

According to embodiments of the present disclosure, an organic light-emitting diode (OLED) device is provided, which can prevent performance of a material of an organic light-emitting layer or TFTs from adverse impact caused by UV light, thereby maintaining performance of the entire OLED device.

First Embodiment

Figure 1:
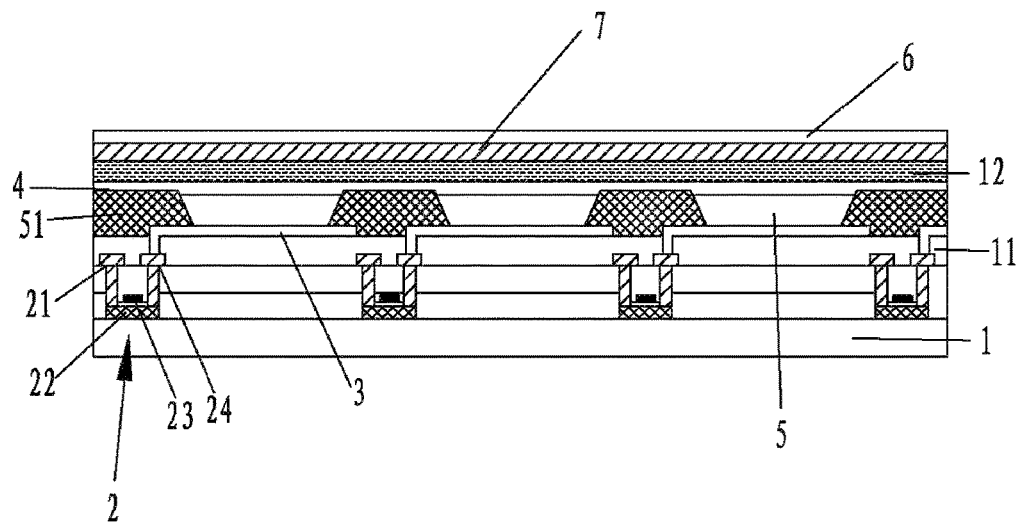
FIG. 1 illustrates a structure of an OLED device according to a first embodiment of the present disclosure.

As shown in FIG. 1, according to this embodiment of the present disclosure, the OLED device includes a substrate 1, thin film transistors (TFTs) 2, an anode 3, a cathode 4, an organic light-emitting layer 5 between the anode and the cathode and configured to emit light, and a light-blocking layer 6 which is configured to block ultraviolet (UV) light and arranged at a light-exiting side of the organic light-emitting layer 5.

In the OLED device according to this embodiment of the present disclosure, alternatively, each of TFTs 2 includes a source electrode 21, an active layer 22, a gate electrode 23, and a drain electrode 24.

In the OLED device according to this embodiment of the present disclosure, alternatively, the anode 3 is provided between the organic light-emitting layer 5 and the substrate 1; a first passivation layer 11 is provided between the anode 3 and the substrate 1; a second passivation layer 12 is provided at an outer side of the cathode 4; and a thin film layer 7 is provided at an outer side of the second passivation layer 12.

In the OLED device according to this embodiment of the present disclosure, alternatively, the light-blocking layer 6 is provided at its outer side of the thin film layer 7.

Second Embodiment

Figure 2:
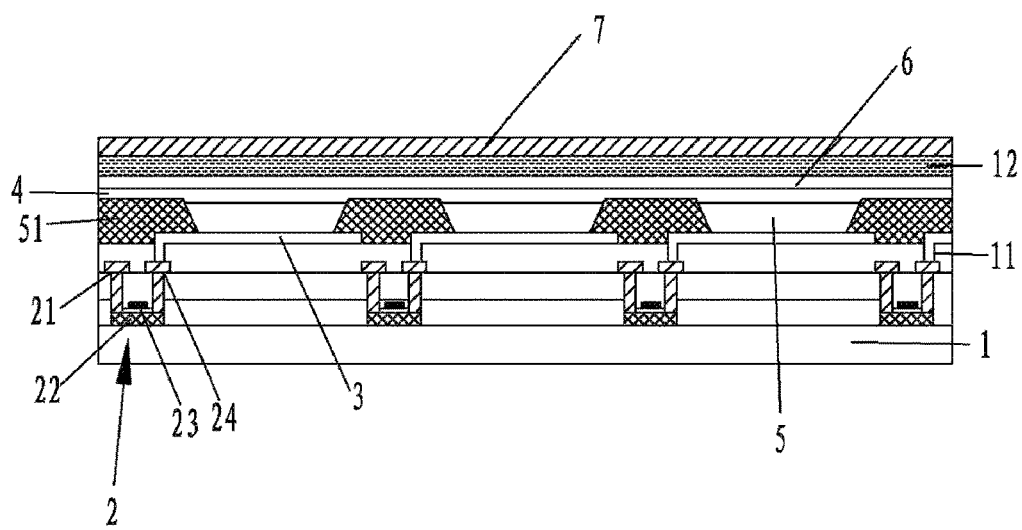
FIG. 2 illustrates a structure of an OLED device according to a second embodiment of the present disclosure.

As shown in FIG. 2, the OLED according to the second embodiment of the present disclosure is different from that according to the first embodiment only in that the light-blocking layer 6 is provided between the second passivation layer 12 and the cathode 4. As a result, not only adverse impact on performance of the organic light-emitting layer or TFTs caused by UV light can be prevented, but also the light-blocking layer 6 can be better protected.

Third Embodiment

Figure 3:
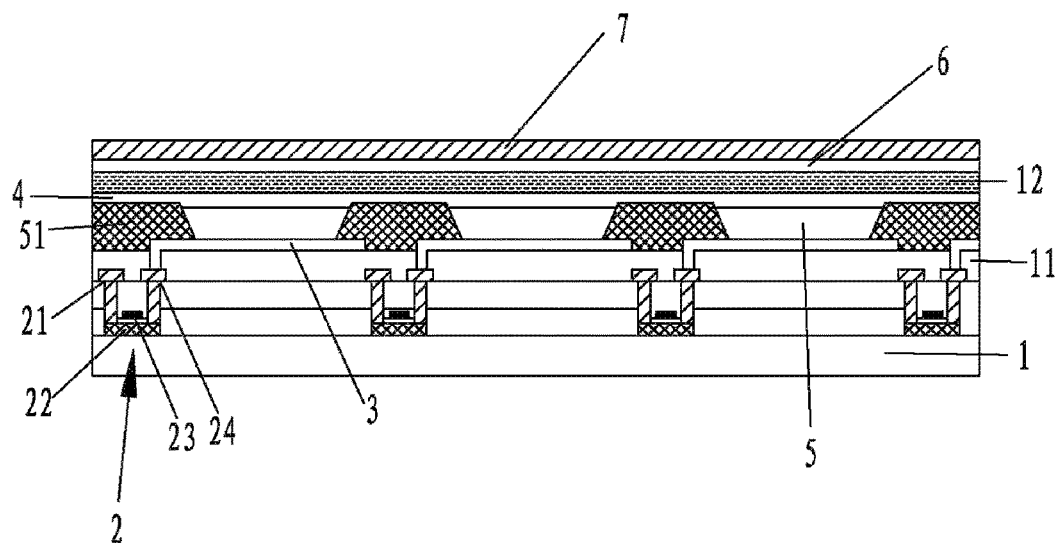
FIG. 3 illustrates a structure of an OLED device according to a third embodiment of the present disclosure.

As shown in FIG. 3, the OLED according to the third embodiment of the present disclosure is different from that according to the first embodiment only in that the light-blocking layer 6 is provided between the thin film layer 7 and the second passivation layer 12. As a result, not only adverse impact on performance of the organic light-emitting layer or TFTs caused by UV light can be prevented, but also the light-blocking layer 6 can be better protected.

Fourth Embodiment

Figure 4:
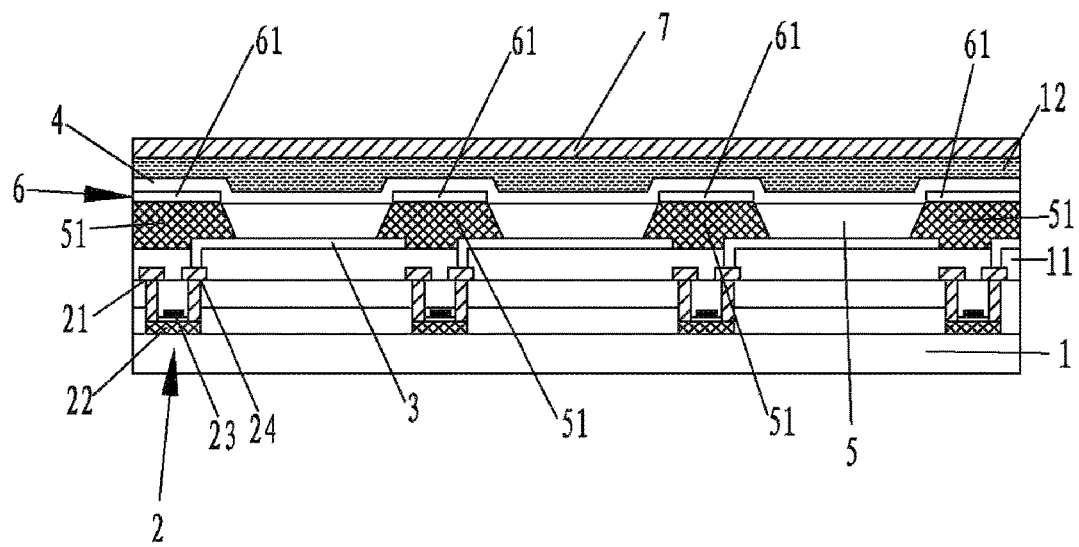
FIG. 4 illustrates a structure of an OLED device according to a fourth embodiment of the present disclosure.

As shown in FIG. 4, the OLED according to the fourth embodiment of the present disclosure is different from that according to the first embodiment only in that the light-blocking layer 6 is provided at its inner side of the cathode 4 and also between the cathode 4 and the organic light-emitting layer 5.

In the OLED device according to this embodiment of the present disclosure, alternatively, the organic light-emitting layer 5 includes light-emitting areas and non-light-emitting areas; the light-blocking layer 6 includes a plurality of light-blocking units 61; and the plurality of light-blocking units 61 corresponds to the non-light-emitting areas of the organic light-emitting layer 5, respectively.

A plurality of pixels is formed by separating the organic light-emitting layer 5 through a plurality of pixel separating walls 51; the plurality of TFTs 2 are provided between the substrate 1 and the anode 3; the plurality of TFTs 2 is arranged in one-to-one correspondence with the plurality of pixel separating walls 51; and the plurality of light-blocking units 61 is arranged in one-to-one correspondence with the plurality of pixel separating walls 51.

In the OLED device according to this embodiment of the present disclosure, alternatively, a length of each of the plurality of light-blocking units 61 is substantially same as a length of the non-light-emitting area within the organic light-emitting layer 5. In other words, the light-blocking layer 6, after a patterning process, only covers the pixel separating walls 51. As a result, not only adverse impact on performance of the organic light-emitting layer or TFTs caused by UV light can be prevented, but also the light-blocking layer 6 can be better protected. In the meantime, a transmittance ratio of the OLED device can be improved and display effect can be enhanced.

Fifth Embodiment

Figure 5:
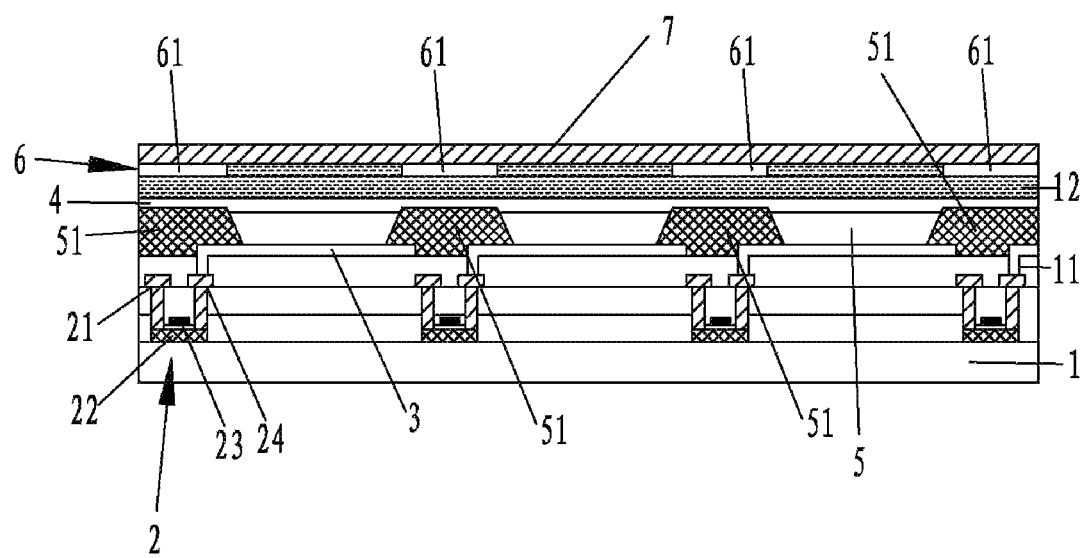
FIG. 5 illustrates a structure of an OLED device according to a fifth embodiment of the present disclosure.

As shown in FIG. 5, in the OLED according to the fifth embodiment of the present disclosure, the light-blocking layer 6 is provided between the thin film layer 7 and the second passivation layer 12.

A plurality of pixels is formed by separating the organic light-emitting layer 5 through a plurality of pixel separating walls 51; the plurality of TFTs 2 are provided between the substrate 1 and the anode 3; the plurality of TFTs 2 is arranged in one-to-one correspondence with the plurality of pixel separating walls 51; the light-blocking layer 6 includes a plurality of light-blocking units 61; and the plurality of light-blocking units 61 is arranged in one-to-one correspondence with the plurality of pixel separating walls 51.

Usually, the organic light-emitting layer includes light-emitting areas and non-light-emitting areas. In the OLED devices according to the first, second, third and fifth embodiments of the present disclosure, the plurality of light-blocking units of the light-blocking layer may correspond to the non-light-emitting areas of the organic light-emitting layer 5. Furthermore, also like the fourth embodiment of the present disclosure, the plurality of light-blocking units corresponds to the plurality of pixel separating walls respectively and a length of each of the plurality of light-blocking units is substantially same as a length of the non-light-emitting area. In other words, the light-blocking layer 6, after a patterning process, only covers the pixel separating walls 51.

The above five embodiments of the present disclosure only illustrate different arrangement positions and shapes of the light-blocking layer 6, which is not limited thereto. It can be appreciated that a skilled person in the art can contemplate other alternatives according to production conditions and process capabilities.

In the OLED device according to this embodiment of the present disclosure, alternatively, the light-blocking layer 6 is made of ZnO, IGZO, $TiO_2$, $SnO_2$, ITZO, AlZO, ZnSnO, HfInZnO, AZTO, AlZnSnO, or ZnON.

In the OLED device according to this embodiment of the present disclosure, alternatively, the TFTs 2 are top-gate TFTs or bottom-gate TFTs.

A display device according embodiments of the present disclosure includes any one of the above OLED devices.

By arranging an oxide UV-light-blocking layer (i.e., a light-blocking layer 6) within the OLED device, the OLED device according to embodiments of the present disclosure can prevent performance of a material of an organic light-emitting layer or TFTs from adverse impact caused by UV light, thereby maintaining performance of the entire OLED device.

Moreover, the light-blocking layer is made of ZnO or IGZO. Oxide semiconductor materials such as ZnO or IGZO can serve as a transparent conductive thin film, which has high transmittance ratio within visual light range and in the meantime have characteristics such as changing UV light's spectrum and absorbing UV light radiation. When the light-blocking layer 6 is made of ZnO or IGZO, not only light transmission from the top-transmit OLED devices will not be affected, but also the UV light from ambient environment can be effectively absorbed.

In the OLED device according to this embodiment of the present disclosure, alternatively, oxide UV-light-blocking layer according to the present disclosure can also be made of $TiO_2$, $SnO_2$, ITZO, AlZO, ZnSnO, HfInZnO, AZTO, AlZnSnO, or ZnON.

Although the present disclosure is described with reference to several typical embodiments, it should be appreciated that the terms used are descriptive and illustrative, rather than limiting terms. Since the present disclosure can be specifically implemented in many forms without departing the spirit or essence of the invention, it shall be appreciated that the above embodiments are not limited to any aforesaid detail, but should be widely construed in the spirit and scope defined in the attached claims. Therefore, all changes and transformations falling into the scope of the claims or equivalent scope thereof shall be covered by the attached claims.

What is claimed is:

1. An organic light-emitting diode (OLED) device, comprising a substrate, thin film transistors (TFTs), an anode, a cathode, and an organic light-emitting layer between the anode and the cathode and configured to emit light,
    wherein the organic light-emitting layer is provided with a light-blocking layer that is configured to block ultraviolet (UV) light, and is arranged at a light-exiting side of the organic light-emitting layer,
    an orthographic projection of the light-blocking layer on the substrate completely covers an orthographic projection of an active layer of the TFT on the substrate, and the light-blocking layer is made of ZnO, IGZO, $SnO_2$, ITZO, AlZO, ZnSnO, HfInZnO, AZTO, AlZnSnO, or ZnON.

2. The OLED device according to claim 1, wherein
    the cathode is provided with a passivation layer at its outer side;
    the passivation layer is provided with a thin film layer at its outer side; and
    the thin film layer is provided with the light-blocking layer at its outer side.

3. The OLED device according to claim 1, wherein
    the cathode is provided with a passivation layer at its outer side;
    the passivation layer is provided with a thin film layer at its outer side; and
    the light-blocking layer is provided between the passivation layer and the cathode.

4. The OLED device according to claim 1, wherein
    the cathode is provided with a passivation layer at its outer side;
    the passivation layer is provided with a thin film layer at its outer side; and
    the light-blocking layer is provided between the thin film layer and the passivation layer.

5. The OLED device according to claim 1, wherein
    the cathode is provided with a passivation layer at its outer side;
    the passivation layer is provided with a thin film layer at its outer side;
    the cathode is provided with the light-blocking layer at its inner side; and
    the light-blocking layer is provided between the cathode and the organic light-emitting layer.

6. The OLED device according to claim 2, wherein
    the organic light-emitting layer comprises light-emitting areas and non-light-emitting areas;
    the light-blocking layer comprises a plurality of light-blocking units; and
    the plurality of light-blocking units corresponds to the non-light-emitting areas, respectively.

7. The OLED device according to claim 3, wherein
    the organic light-emitting layer comprises light-emitting areas and non-light-emitting areas;
    the light-blocking layer comprises a plurality of light-blocking units; and
    the plurality of light-blocking units corresponds to the non-light-emitting areas, respectively.

8. The OLED device according to claim 4, wherein
    the organic light-emitting layer comprises light-emitting areas and non-light-emitting areas;
    the light-blocking layer comprises a plurality of light-blocking units; and
    the plurality of light-blocking units corresponds to the non-light-emitting areas, respectively.

9. The OLED device according to claim 5, wherein
the organic light-emitting layer comprises light-emitting areas and non-light-emitting areas;
the light-blocking layer comprises a plurality of light-blocking units; and
the plurality of light-blocking units corresponds to the non-light-emitting areas, respectively.

10. The OLED device according to claim 6, wherein
a length of each of the plurality of light-blocking units is substantially same as a length of the non-light-emitting area within the organic light-emitting layer.

11. The OLED device according to claim 7, wherein
a length of each of the plurality of light-blocking units is substantially same as a length of the non-light-emitting area within the organic light-emitting layer.

12. The OLED device according to claim 8, wherein
a length of each of the plurality of light-blocking units is substantially same as a length of the non-light-emitting area within the organic light-emitting layer.

13. The OLED device according to claim 9, wherein
a length of each of the plurality of light-blocking units is substantially same as a length of the non-light-emitting area within the organic light-emitting layer.

14. The OLED device according to claim 6, wherein
a plurality of pixels is formed by separating the organic light-emitting layer through a plurality of pixel separating walls;
the TFTs are provided between the substrate and the anode;
the TFTs are arranged in one-to-one correspondence with the plurality of pixel separating walls; and
the plurality of light-blocking units is arranged in one-to-one correspondence with the plurality of pixel separating walls.

15. The OLED device according to claim 7, wherein
a plurality of pixels is formed by separating the organic light-emitting layer through a plurality of pixel separating walls;
the TFTs are provided between the substrate and the anode;
the TFTs are arranged in one-to-one correspondence with the plurality of pixel separating walls; and
the plurality of light-blocking units is arranged in one-to-one correspondence with the plurality of pixel separating walls.

16. The OLED device according to claim 8, wherein
a plurality of pixels is formed by separating the organic light-emitting layer through a plurality of pixel separating walls;
the TFTs are provided between the substrate and the anode;
the TFTs are arranged in one-to-one correspondence with the plurality of pixel separating walls; and
the plurality of light-blocking units is arranged in one-to-one correspondence with the plurality of pixel separating walls.

17. The OLED device according to claim 9, wherein
a plurality of pixels is formed by separating the organic light-emitting layer through a plurality of pixel separating walls;
the TFTs are provided between the substrate and the anode;
the TFTs are arranged in one-to-one correspondence with the plurality of pixel separating walls; and
the plurality of light-blocking units is arranged in one-to-one correspondence with the plurality of pixel separating walls.

18. The OLED device according to claim 1, wherein the TFTs are top-gate TFTs or bottom-gate TFTs.

19. A display device, comprising the OLED device according to claim 1.

* * * * *